United States Patent [19]
Walker et al.

[11] Patent Number: 5,288,943
[45] Date of Patent: Feb. 22, 1994

[54] METHOD OF PROVIDING BENDS IN ELECTRICAL LEADS, AND ARTICLES MADE THEREBY

[75] Inventors: Kevin E. Walker, Harrisburg; Klaus D. Brunnengraeber, Red Lion, both of Pa.

[73] Assignee: The Whitaker Corporation, Wilmington, Del.

[21] Appl. No.: 10,028

[22] Filed: Jan. 27, 1993

[51] Int. Cl.⁵ .............................. H01L 23/02
[52] U.S. Cl. ............................ 174/52.4; 29/857; 437/220
[58] Field of Search ............ 174/52.2, 52.3, 52.4, 174/52.6; 29/856, 857, 855, 854, 739, 741, 827, 825; 140/105; 437/220; 361/306, 307, 308

[56] References Cited

U.S. PATENT DOCUMENTS

| | | | |
|---|---|---|---|
| 3,416,348 | 9/1966 | Carter et al. | 72/220 |
| 3,940,786 | 2/1976 | Scheingold et al. | 357/74 |
| 4,333,213 | 1/1982 | Meal et al. | 29/25.42 |
| 4,398,069 | 8/1983 | Olsson | 200/6 R |
| 4,497,012 | 1/1985 | Gottlieb et al. | 361/306 |
| 4,553,420 | 11/1985 | Fierkens et al. | 72/380 |
| 4,633,582 | 1/1987 | Ching et al. | 29/827 |
| 4,959,505 | 9/1990 | Ott | 174/52.2 |
| 5,012,664 | 5/1991 | Hembree | 72/404 |
| 5,065,504 | 11/1991 | Olla | 29/827 |
| 5,105,857 | 4/1992 | Ellis | 140/105 |
| 5,153,981 | 10/1992 | Soto | 29/701 |
| 5,202,289 | 4/1993 | van Kempen | 437/220 |

*Primary Examiner*—Leo P. Picard
*Assistant Examiner*—Christopher Horgan
*Attorney, Agent, or Firm*—Robert J. Kapalka

[57] ABSTRACT

The invention minimizes openings or cracks near the position at which a solder tail of a lead frame extends through a wall of a case molded about the lead frame and through which wall the solder tail extends, so as to prevent leakage through the wall near the solder tail. To accomplish this, a double-bend is formed in the solder tail before encapsulation of the lead frame. The double-bend comprises a first downward right-angle bend just outside the case wall, and an adjacent distally-spaced opposite bend such that the distal end portion of the solder tail extends substantially parallel to the plane of the lead frame. Subsequently, an anvil is positioned to support the portion of the lead tail between the case wall and the first downward bend in the solder tail, while a forming tool forces the distal end portion of the soldering tail downward to the desired final position. The final bending occurs primarily around the previously-formed opposite bend, rather than at or immediately adjacent to the case wall, thereby substantially eliminating openings in the molded case body where the solder tail passes through the case wall.

2 Claims, 4 Drawing Sheets

METHOD OF PROVIDING BENDS IN ELECTRICAL LEADS, AND ARTICLES MADE THEREBY

FIELD OF THE INVENTION

This invention relates to a method and system for providing bends in electrical leads and to articles made by such method; it relates especially to providing bends in solder tails extending outward from a lead frame, through a molded case, which solder tails are later to be bent downwardly for connection to an underlying socket or printed-circuit board, for example.

BACKGROUND OF THE INVENTION

Although applicable to other electrical leads, the invention will be described with particular reference to solder tails on lead frames. Lead frames are commonly used to provide connections between electrical components inside the molded case of an electrical component package, and to provide electrically-conducting connectors extending from the interior to the exterior of the molded case. For example, an electric component and its lead frame may be at least partially enclosed in a dielectric case with leads therefrom extending outward through a wall of the case to the exterior. The external leads typically constitute so-called solder tails, which enable connection to an associated printed-circuit board or the like. Also typically, the solder tails initially extend directly outward from the molded case in a straight line, parallel to the plane of the lead frame, and are later bent sharply downwardly at right angles, after the molding operation, so their lower ends can be soldered in position on a printed circuit board, for example, in conventional manner.

It has been found that, in some cases, the interior of the case contains harmful contaminants traceable to contaminants produced during the lead-soldering operations. The present invention greatly reduces or eliminates such contamination of the interior of the case by contaminants generated outside the case.

SUMMARY OF THE INVENTION

We have found that the above-described contamination is due in large measure to the standard procedures used to bend the solder tails downwardly, which procedures exert such stresses on the molded case wall where the leads pass through it, that minute cracks or openings are produced in the case near the leads; it is through these openings that contaminants, such as those arising from subsequent soldering or other near-by heat-bonding operation, easily pass.

In accordance with the invention, such problems are minimized or eliminated entirely by providing in each lead, prior to the molding operation, a double-bend consisting of a first downward bend positioned to lie just outside the case, and a compensating upward bend positioned farther outward from the outside of the case; and later, after the molding operation is complete, bending the distal portion of each lead downwardly, at the above-mentioned upward bend, while at the same time supporting the portion of the lead between the case and the downward bend by means of an anvil member. Since this final downward bending occurs primarily at the outwardly-positioned upward bend, rather than at or near the wall of the case, it is accomplished without unduly stressing the interface between the bent lead and the molded case. As a result, the abovedescribed cracks or openings are eliminated or greatly reduced, and the undesirable contamination of the interior of the case is also substantially eliminated.

BRIEF DESCRIPTION OF THE DRAWINGS

These and other objects and features of the invention will be more readily understood from a consideration of the following detailed description, taken with the accompanying drawings, in which.

DETAILED DESCRIPTION OF PREFERRED EMBODIMENTS

Figure 1:
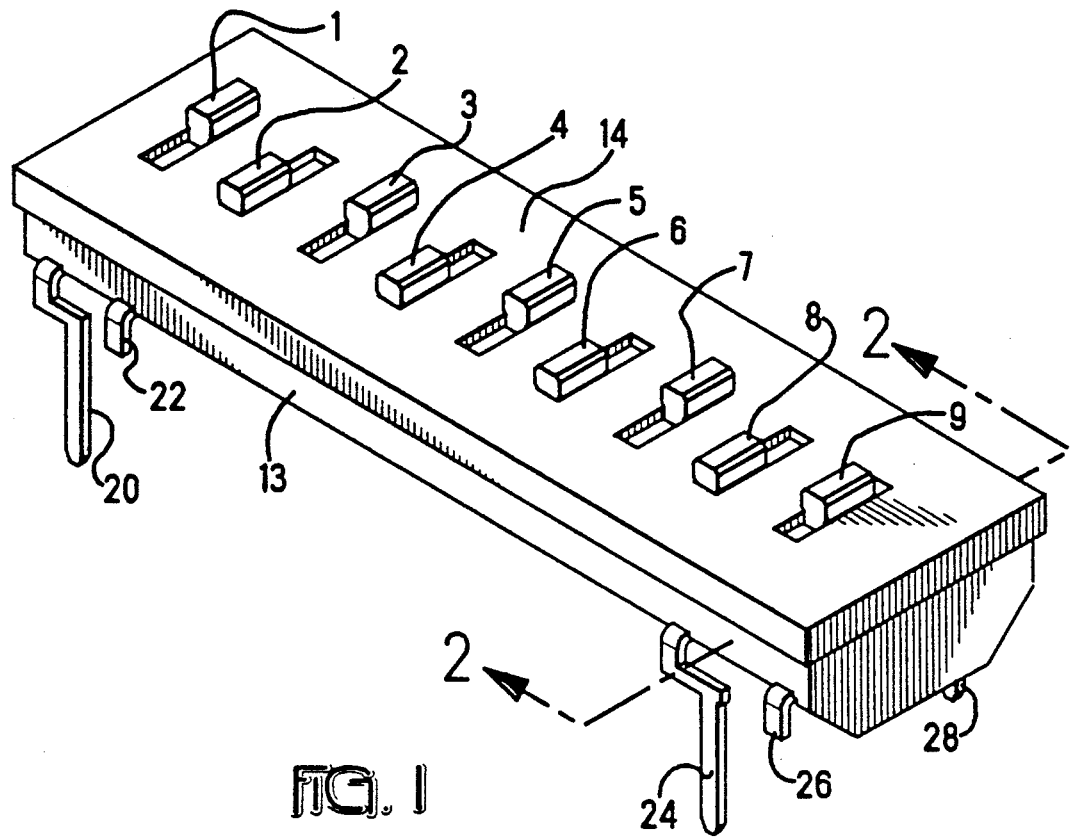
FIG. 1 is an isometric view of a packaged electronic switching system having externally-extending solder tails bent in accordance with the present invention.

Referring now to the preferred embodiment of the invention shown in the drawings by way of example only, the invention is illustrated as applied to a ternary switching system which in this case comprises nine three-position switches, with nine respective operating sliders marked 1 through 9 in FIG. 1. Each switch has a central switch position in which the corresponding switch output lead or solder tail is, in effect, disconnected; a second position in which it is connected to a positive-potential bus bar within the switch assembly; and a third position in which the switch output lead is supplied with a relatively negative potential, which may be ground or reference potential in some cases.

Figure 2:
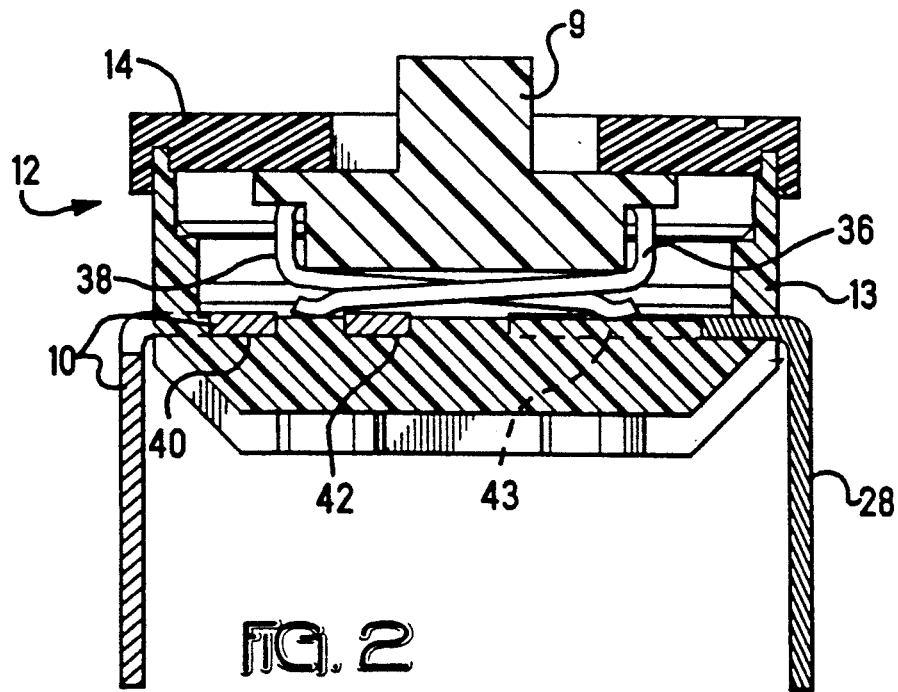
FIG. 2 is a cross-sectional view taken on lines 2—2 of FIG. 1.

More particularly, and referring especially to FIGS. 1 and 2, in the final product shown a lead frame 10 is enclosed in a plastic case or housing 12 comprising a lower molded body 13 and a top cover 14 sealed to it, with solder-tail leads such as 20, 22, 24, 26 and 28 extending outwardly through the walls of the molded case. Each switch is like that shown in FIG. 2, in which the manually-actuatable slide button 9 is used to move the interconnected slider contacts 36 and 38 back and forth, so that contact 36 in one position contacts bus bar 40, in another position contacts bus bar 42, and in an intermediate position contacts the case between them, all while contact 38 remains in sliding contact with bus bar 43 of the lead frame.

Figure 3:
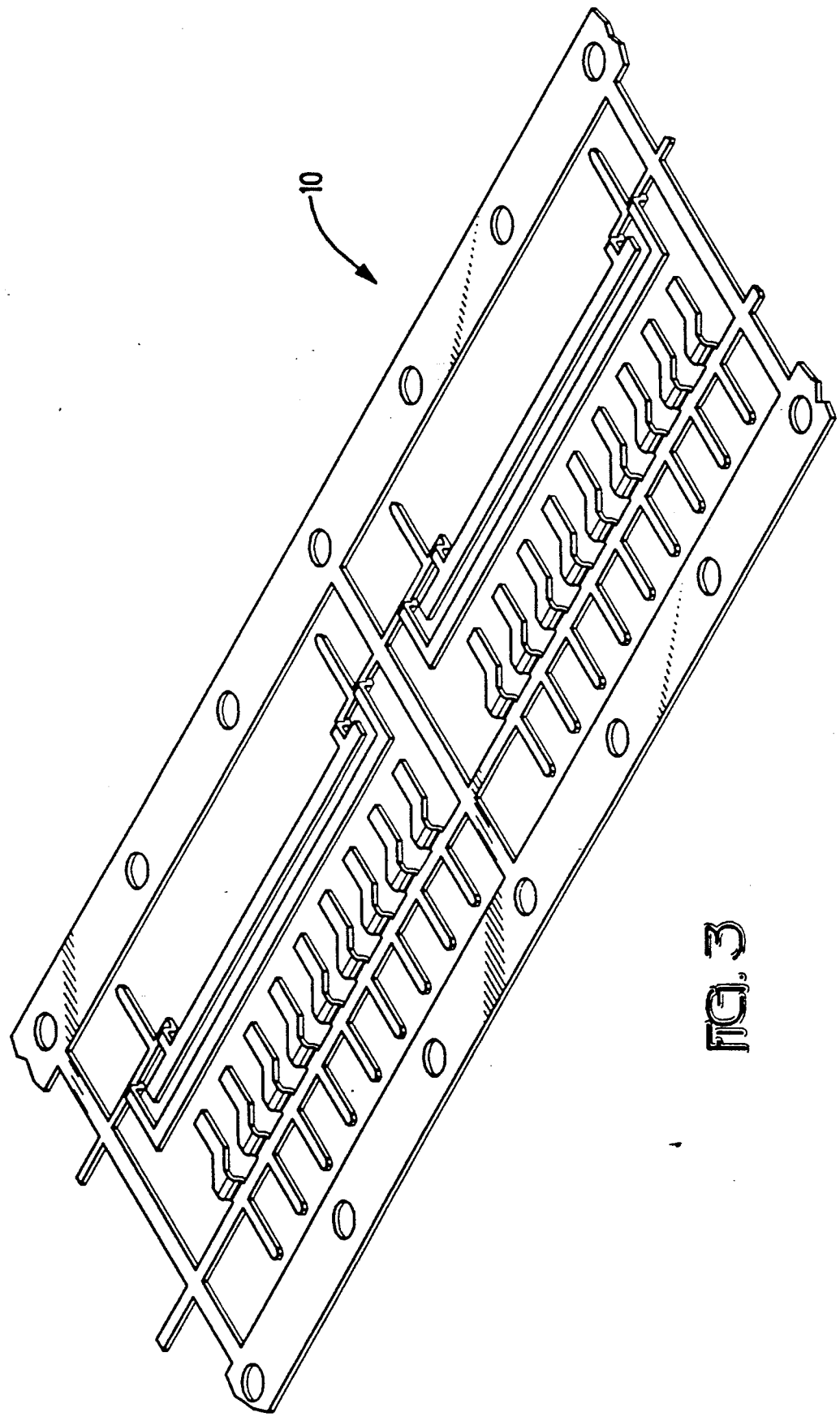
FIG. 3 is an isometric view of two frames of a strip of lead frame, to which the double bend of the invention is applied.
Figure 5:
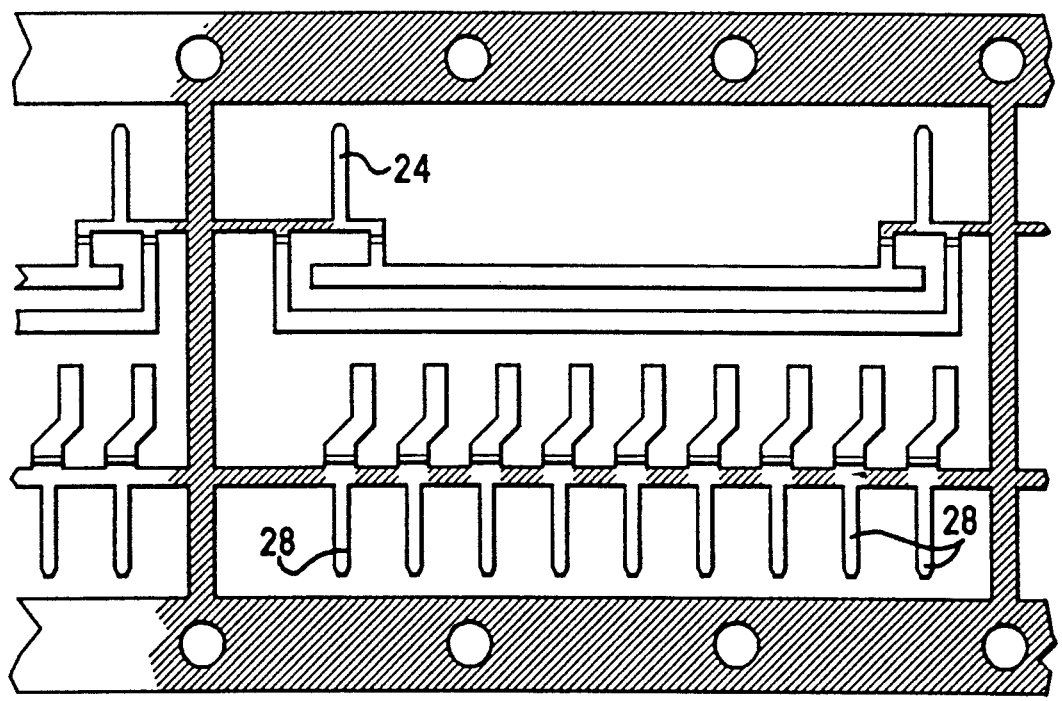
FIG. 5 is a plan view of a lead frame, showing where various parts are cut away.

Two typical lead frames of a series of joined lead frames are shown in FIG. 3, as they are initially stamped out, and prior to cutting off of the parts shown shaded in FIG. 5. The details of the lead frames are not important to the present invention, so long as at least one lead extends through the case wall and is to be bent downwardly. Accordingly, the lead frame and the known details of its manufacture will not be described except insofar as they relate especially to the present invention. It is only noted that each of the nine adjacent solder tails such as 28 extends outwardly through the case wall, and is eventually bent downwardly for use in connecting the switch assembly to a PC board, for example.

Figure 4:
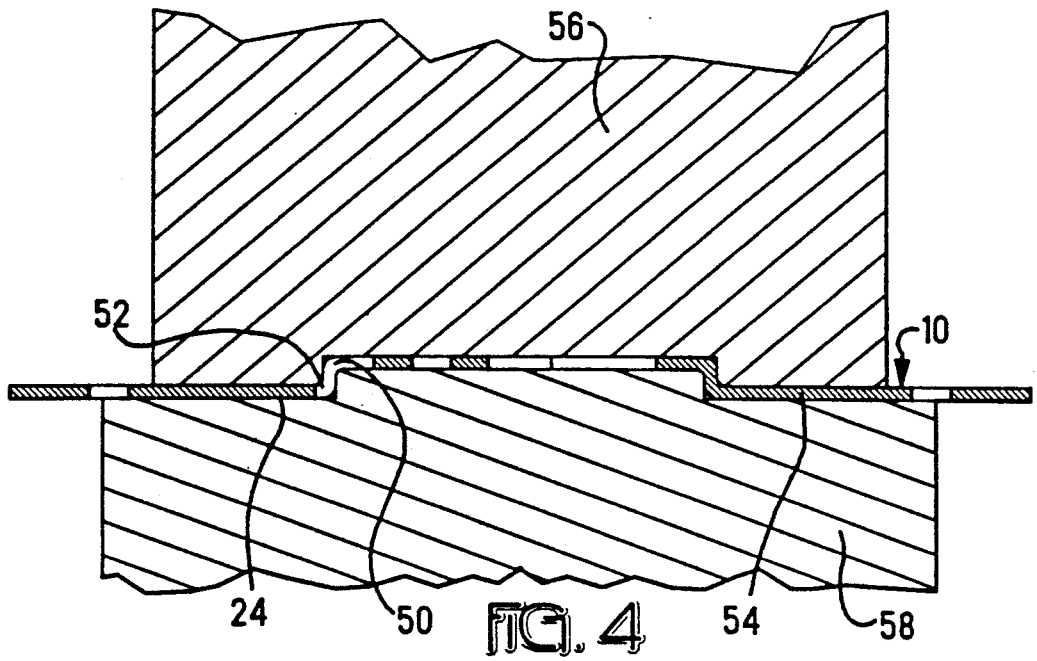
FIG. 4 is a cross-sectional view illustrating how the double bend is formed.
Figure 6:
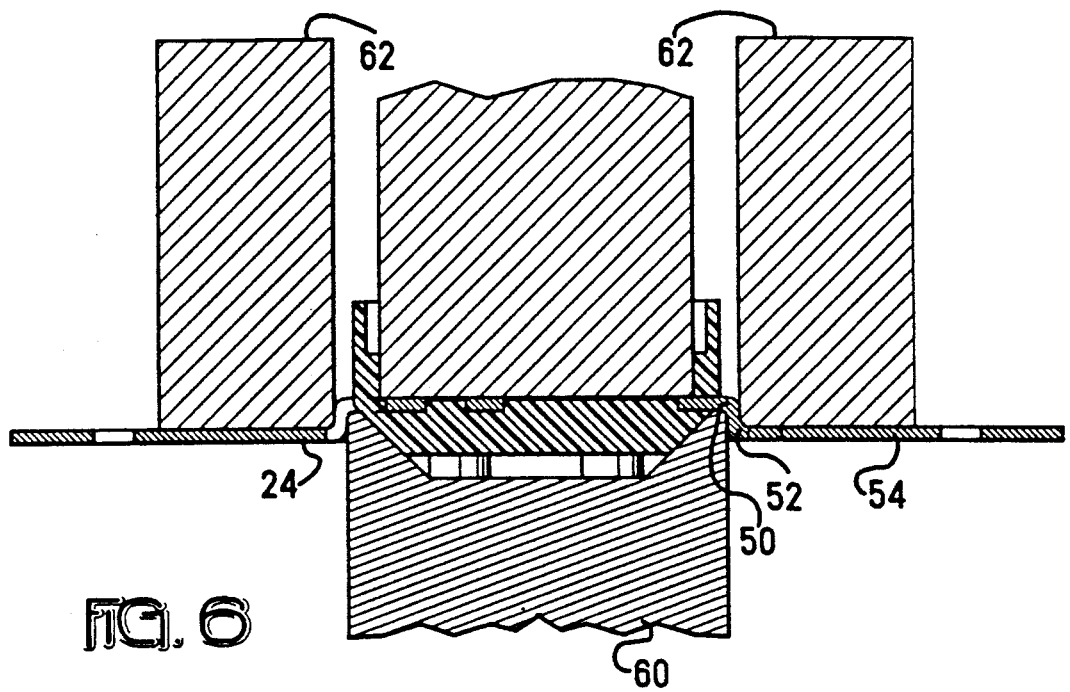
FIG. 6 is a cross-sectional view illustrating the beginning of the final bending-down of the solder tails.

As shown in FIGS. 4 and 6, each solder tail such as 24 is provided with a double bend - first, a right-angle downward bend 50 positioned just outside the position of the outside of the case wall and then, adjacent to the downward bend and just distally thereof, a second, upward or opposite right-angle bend 52, so that the distal end 54 of the solder tail extends outwardly, generally parallel to the plane of the lead frame. When the distal portion of the solder tail is later bent downwardly by a downward forming force, with the underside of bend 50 supported by an anvil, the bending and stretching of the solder tail will occur distally of bend 50, primarily at bend 52, and therefore will not disturb the integrity of the seal where the solder tail passes through the case wall. Contaminants from the adjacent environment are therefore prevented from leaking into the interior of the case, as desired.

The preferred steps in forming the double-bend are shown in FIGS. 4–6 and 7. Referring first of FIG. 4, the lead frame is subjected to a progressive die process for stamping and bending it, which includes placement of the lead frame 10 between a forming tool 56 and an anvil 58, shaped so that as the forming tool and the anvil are pressed together they form the bends 50 and 52 as described above.

Figure 7:
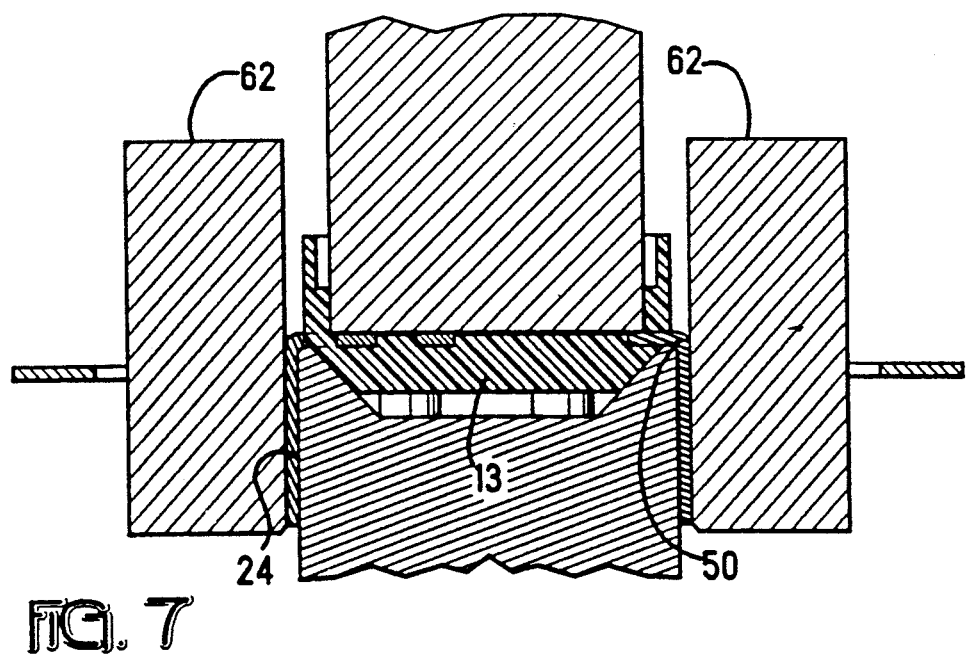
FIG. 7 is a cross-sectional view, showing the final bending step completed.

FIG. 6 shows the beginning of the subsequent downward bending of the distal portions of the solder tails such as 28. An anvil 60 supports the case and the first downward bends 50 against downward motion, while the forming tool 62 is applied to the distally-extending portions of the solder tails. Subsequent downward motion of forming tool 62 bends the solder tails straight downward, as shown in FIG. 7, to provide the final desired shape of the solder tails. After this the top cover 14 is heat-sealed to the top of the case body 13.

In this process, care is taken to assure that the final downward bending of the solder tails occurs primarily at the second, upward bend 52, by holding stationary the portion of the solder tail between the case wall and the first downward bend, thereby limiting the bending primarily to the second bend region.

While the invention has been described with particular reference to specific embodiments in the interest of complete definiteness, it will be understood that it may be embodied in a variety of forms diverse from those specifically shown and described, without departing from the spirit and scope of the invention.

What is claimed is:

1. An improved method of providing an electronic package, said package including a lead frame and a plastic case molded about at least a portion of said lead frame, with at least one electrical lead extending from said lead frame outwardly through a wall of said case, said method comprising the steps of:

forming a lead frame having at least one electrical lead which extends outwardly therefrom substantially parallel to a plane of said lead frame;

molding a plastic case about at least a portion of said lead frame, with said at least one lead extending outwardly through a wall of said case; and providing a subsequent bending downwardly of said outwardly-extending lead, to cause it to extend substantially at a right angle to said plane;

the improvement comprising the step of:

forming a double bend in said lead prior to said molding, said double bend comprising a first, downward bend positioned so as to be disposed just outside said wall of said case after said molding, and a second, upward bend positioned adjacent said first bend and distally thereof;

wherein said subsequent bending downwardly of said lead comprises bending downwardly a distal end of said lead lying distally beyond said second, upward bend, while supporting against bending an initial part of said lead located between said wall of said case and said first bend.

2. The method of claim 1, wherein said forming of said double-bend comprises bending said lead over a first anvil system, and said subsequent bending downwardly comprises holding an anvil against and beneath said initial part of said lead extending between said case wall and said first bend, while moving a forming tool downwardly against the distal end of said lead which extends distally beyond said second bend.

* * * * *